United States Patent [19]

Paunovic et al.

[11] Patent Number: 5,294,486

[45] Date of Patent: Mar. 15, 1994

[54] BARRIER IMPROVEMENT IN THIN FILMS

[75] Inventors: Milan Paunovic, Port Washington; King-Ning Tu, Chappaqua, both of N.Y.

[73] Assignee: International Business Machines Corporation, Armonk, N.Y.

[21] Appl. No.: 37,742

[22] Filed: Mar. 29, 1993

Related U.S. Application Data

[63] Continuation of Ser. No. 601,492, Oct. 22, 1990, abandoned.

[51] Int. Cl.$^5$ .............................................. B32B 15/00
[52] U.S. Cl. .................................. 428/672; 428/675; 428/929; 257/751
[58] Field of Search ............. 428/672, 620, 675, 671, 428/680, 929; 257/751

[56] References Cited

U.S. PATENT DOCUMENTS

| | | | |
|---|---|---|---|
| 3,362,851 | 1/1968 | Dunster | 428/472 |
| 3,663,184 | 5/1972 | Wood et al. | 428/620 |
| 3,883,947 | 5/1975 | Kruger et al. | 29/578 |
| 4,016,050 | 4/1977 | Lesh et al. | 204/15 |
| 4,109,297 | 8/1978 | Lesh et al. | 361/402 |
| 4,273,859 | 1/1981 | Moneo et al. | 437/190 |
| 4,300,149 | 11/1981 | Howard et al. | 257/751 |
| 4,319,264 | 3/1982 | Gangulee et al. | 357/71 |
| 4,410,622 | 10/1983 | Dalal et al. | 437/190 |
| 4,424,527 | 1/1984 | Rao et al. | 357/71 |
| 4,478,881 | 10/1984 | Bartur et al. | 427/90 |
| 4,495,222 | 1/1985 | Anderson et al. | 427/89 |
| 4,654,224 | 3/1987 | Allred | 437/190 |
| 4,666,796 | 5/1987 | Levine | 428/672 |
| 4,742,023 | 5/1988 | Hasegawa | 437/183 |
| 4,753,851 | 6/1988 | Roberts et al. | 428/620 |
| 4,796,082 | 1/1989 | Murakami et al. | 437/190 |
| 4,816,424 | 3/1989 | Watanabe et al. | 437/190 |
| 4,954,423 | 9/1990 | McMann et al. | 437/190 |
| 4,998,158 | 3/1991 | Johnson et al. | 257/751 |
| 5,019,234 | 5/1991 | Harper | 437/190 |
| 5,106,781 | 4/1992 | Penning De Vries | 437/190 |

FOREIGN PATENT DOCUMENTS

| | | | |
|---|---|---|---|
| 54-131867 | 10/1979 | Japan | 437/190 |
| 61-177746 | 8/1986 | Japan | 437/190 |
| 62-229973 | 10/1987 | Japan | 257/751 |
| 63-234562 | 9/1988 | Japan | 257/757 |
| 1-238042 | 9/1989 | Japan | 437/190 |
| 2186597A | 8/1957 | United Kingdom | 428/672 |

OTHER PUBLICATIONS

R. S. Nowicki et al., "General Aspects of Barrier Layers . . . ", Thin Solid Films, 96 (1982), pp. 317–326.
M. Revitz et al., IBM Technical Disclosure Bulletin, vol. 14, No. 11, Apr. 1972, p. 3358, "Metallurgy Barrier for Au and Pb".
P. S. Ho et al., IBM Technical Disclosure Bulletin, vol. 21, No. 4, Sep. 1975, p. 1753.
Thin Solid Films, 52 (1978) 415–443, "Diffusion Barriers in Thin Films" by M.-A. Nicolet.
Tu et al—"Electronic Thin Film Science" MacMillan Pub. Co. N.Y. 1992 Introduction—p. 1.
Call for Papers—"Electrochemically Deposited Thin Films" Electrochemical Society 1993 p. 5.

*Primary Examiner*—John Zimmerman

[57] ABSTRACT

An improved thin film barrier with three layers where an interlayer is between barrier layers on each side, the interlayer serving as an atom energy sink. The improved barrier in the diffusion of Cu through Ni into Au where the barrier layers are Ni and the interlayer is Au, making a stack of AuNiAuNiCu, reduces the Cu present in the external Au layer after prolonged annealing in the vicinity of 0.2% atomic.

4 Claims, 4 Drawing Sheets

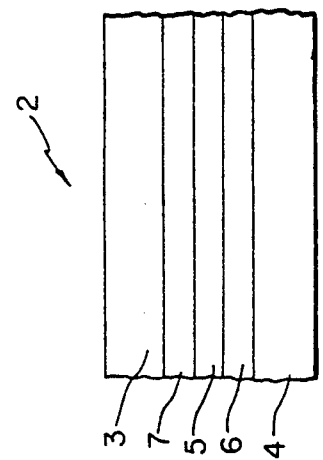
FIG. 4
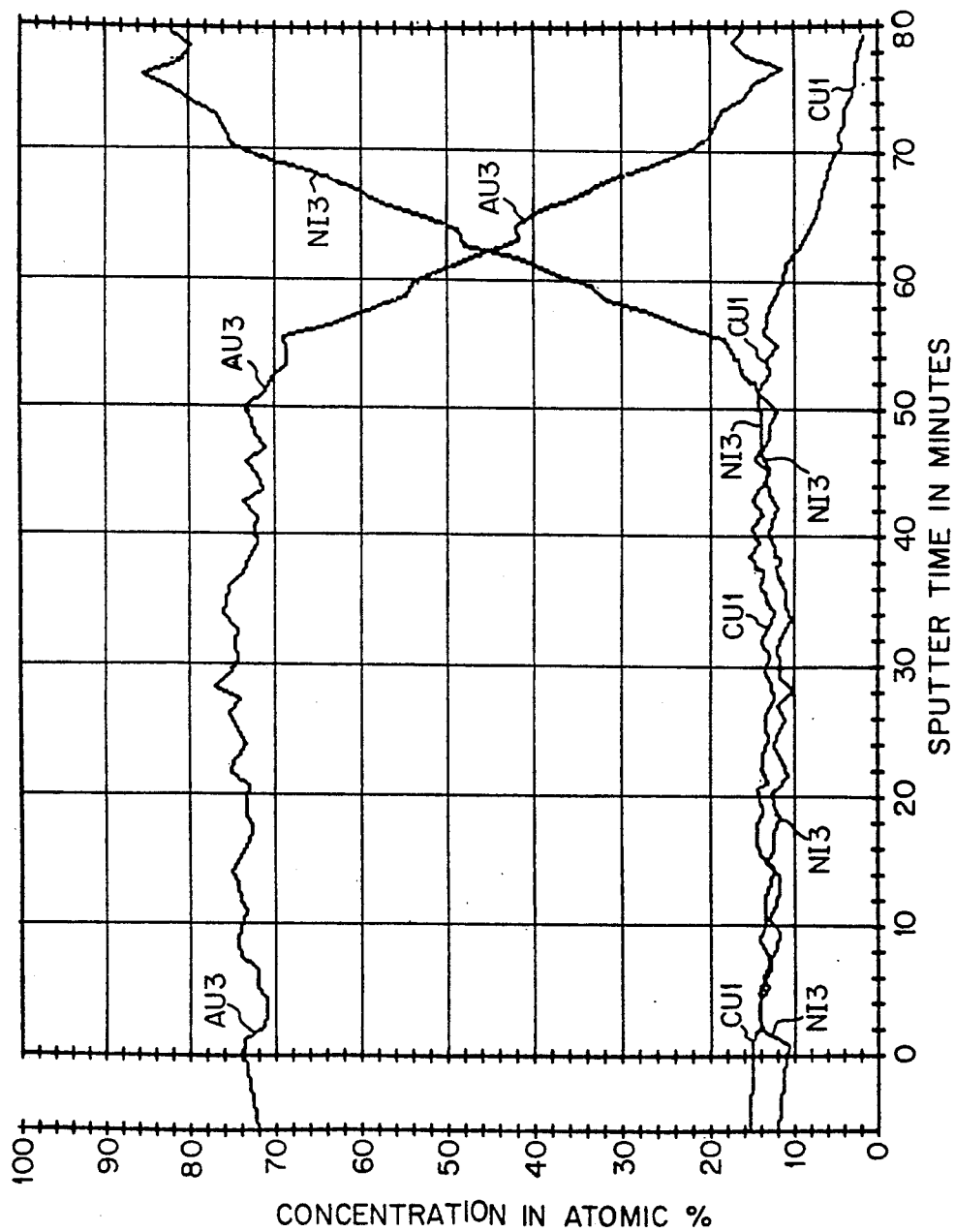
FIG. 3 PRIOR ART [ SAMPLE THICKNESS DIMENSIONS −Au 2030Å/Ni 2.1μm/Cu 2μm/Cr 400Å/Si− ]

BARRIER IMPROVEMENT IN THIN FILMS

This application is a Continuation of U.S. Ser. No. 07/601,492, filed Oct. 22, 1990, now abandoned.

FIELD OF THE INVENTION

The invention relates in general to barriers in thin films, particularly thin film diffusion barriers, and more particularly barriers such as are used in electronic devices and semiconductor and other solid state device contacts.

BACKGROUND OF THE INVENTION AND RELATION TO THE ART

In thin film metallurgy the detrimental effects of diffusion of atoms from one film layer to another have long been realized. Any interdiffusion of atoms from another layer generally means a change in characteristics with time. Some changes in characteristics may be as simple as direct variation of a single parameter, such as resistivity, adhesion, ductility and solderability. In more complex applications, such as semiconductor devices where atomic scale impurity levels are involved, unwanted atoms appearing by diffusion can cause catastrophic device failure.

Ordinarily, diffusion is considered to be a relatively slow and predictable bulk effect. With thin films, however, the effect proceeds much faster than would be expected with merely a bulk effect. Short distances, grain boundaries and defects are thought to be involved.

The diffusion barrier structure is usually a single layer positioned in a series of layers that operates to control, prevent or retard the travel, within the film layers, of atoms from one location to another where the presence of those atoms is detrimental.

Other barrier structure layers may be inserted in a thin film stack to prevent or produce compound formation between potentially interacting layers.

In semiconductor technology, the diffusion effect and compound formation effect is aggravated not only by the sensitivity of the devices but also by the thermal stresses in the process windows in manufacture. In semiconductor technology, a process window is the temperature level and time at that level allotted to a step in the fabrication of the device or array of devices, such as an integrated circuit. In making such devices or arrays, there may be many process window temperature excursions that can have a cumulative effect.

In the semiconductor art, there are functions needed in contacts either to facilitate manufacturing or performance and a particular metal that can impart the needed function is introduced into a thin film stack for that purpose. There may be many layers, each of a different metal, for a different purpose. As examples, copper (Cu) or aluminum (Al) for conductivity, gold (Au) for corrosion resistance and solderability, and chromium (Cr) for adhesion. As the art has developed, barrier technology has evolved into single layer structures. A thin film diffusion barrier structure of nickel (Ni) for retarding diffusion of atoms between Cu generally present for conductivity and Au generally present for corrosion resistance and solderability has become extensively used. One example of such a structure is in U.S. Pat. No. 4,016,050.

Another type of barrier structure is shown in U.S. Pat. No. 4,816,424 using titanium nitride (TiN)-tungsten (W) to prevent interdiffusion of Al and silicon (Si) where Al is used as a conductor.

Still another barrier structure is shown in U.S. Pat. No. 4,478,881 where in fabrication a layer of W is placed between an Al conductor and a Ni contacting layer on a Si semiconductor device which after processing results in a single barrier layer of W that prevents a chemical reaction between Al and a NiSi contacting compound.

SUMMARY OF THE INVENTION

An improvement in barrier technology is achieved by providing a multiple layer barrier structure in a thin film stack having at least three layers, wherein there is an internal layer of at least one material that operates to enhance the overall controlling, preventing or retarding function of the barrier structure. The internal layer material provides atomic movement inhibiting properties in the form of interfaces, grain boundary and defect changes, relative concentrations and at least some functions of a condition in thin film technology known as a sink.

A new diffusion barrier structure of NiAuNi is provided that is an improvement over the extensively used single Ni layer diffusion barrier structure in a thin film stack where interdiffusion of Cu and Au in the stack is to be inhibited.

The invention provides the benefits of a radical reduction in diffused and interacting species; enlargement in the selection of materials and greater overall barrier perfection. In the thin film stack of AuNiAuNiCu the practical elimination of the diffusion of Cu into Au eliminates brittleness, reduces corrosion and enhances solderability.

BRIEF DESCRIPTION OF THE DRAWINGS

FIG. 3 is an Auger analysis graph at a different Ni thickness of the single layer barrier of FIG. 1 after annealing and where the barrier layer is Ni and the external layers are Au and Cu.

FIG. 4 is a schematic cross sectional view of the improved barrier of this invention.

DESCRIPTION OF THE INVENTION

Figure 1:
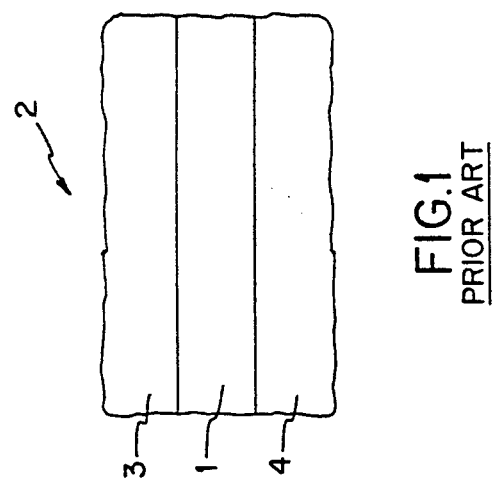
FIG. 1 is a schematic cross sectional view of a prior art single layer barrier structure.

Referring to FIG. 1, there is shown a prior art type barrier structure wherein a single layer 1 is introduced in a thin film stack 2 for the purpose of preventing such interaction between layers 3 and 4 as diffusion, compound formation and mutual dissolution. The barrier layer structure prevents or retards unwanted atoms from either layer 3 or layer 4 from reaching and interacting with the atoms of the other layer. The thin film layers in the stack 2 are of micrometer thicknesses and in being subjected to a variety of thermal stresses in fabrication there is some migration of atoms of either layer 3 or 4 into the other layer.

In FIGS. 2, 3, 6 and 7, graphs of concentration in atomic % vs sputter time in minutes are provided of the results of Auger electron spectroscopy combined with sputter sectioning to obtain a depth profile. The sputtering was done with 2K eV Argon ions at the rate of 50-60 Å per minute.

Figure 2:
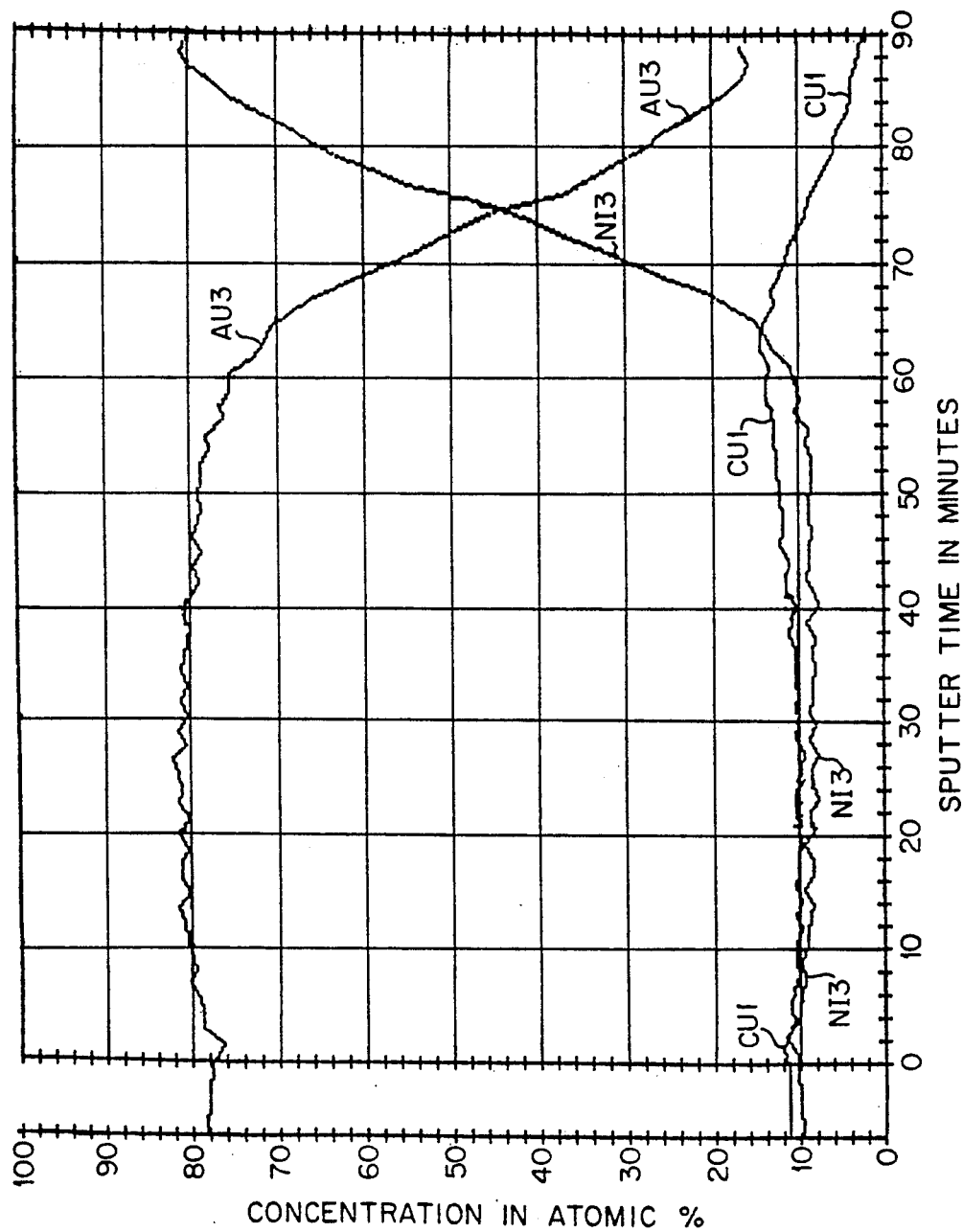
FIG. 2 is an Auger analysis graph of the single layer barrier of FIG. 1 after annealing and where the barrier layer is Ni and the external layers are Au and Cu.

Referring next to FIG. 2, an Auger type material analysis graph is provided of the prior art type of single layer barrier of FIG. 1 as it would be applied in a semiconductor contact environment with an extensively used diffusion barrier structure of AuNiCu.

In FIG. 2, the sample analyzed has a 400 Å thick Cr adhesion layer on a Si substrate supporting as in FIG. 1, a 2 μm thick, electrodeposited from a nickel sulfamate solution, barrier layer 1 of (Ni) introduced into the stack 2 for the purpose of retarding diffusion of atoms from a 2 μm thick Cu layer into a 2700 Å thick Au layer 3. A two hour 400° C. annealing cycle designed to simulate the cumulative effect of multiple processing thermal stresses was applied to the sample. The analysis of FIG. 2 illustrates that the retarding effect of the single layer Ni barrier 1 is insufficient under these conditions to prevent Cu diffusion out of layer 4 through the barrier layer 1 and into the Au layer 3 to the level where the Au layer 3 contains about 10 percent (atomic) Cu and about 10 percent (atomic) Ni.

Referring next to FIG. 3, the analysis of FIG. 2 is confirmed in a microprobe type analysis wherein the Cu and Ni are present in the Au layer at essentially the same levels.

The improved barrier of the invention is described in connection with FIG. 4. In FIG. 4, in the stack 2, the barrier is made up of an interlayer 5 separated from layer 4 on one side by layer 6 and from layer 3 on the other side by layer 7. The interlayer 5 performs the function of the sink condition known in the art in trapping or combining with moving atoms. The layers 6 and 7 each operate generally as a barrier and they also assist in relaxing material compatibility and thus permit combinations of materials that will more nearly approach barrier perfection.

The layer 5 may be an element or a compound that when an interacting or diffusing atom encounters or enters it, a sinking function of the layer transforms the atom to a different and lower energy state.

BEST MODE OF CARRYING OUT THE INVENTION

Figure 5:
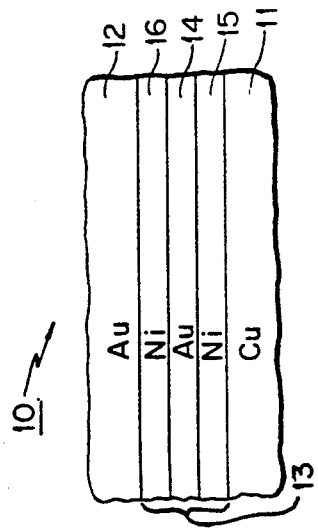
FIG. 5 is a schematic cross sectional view of an embodiment of the invention.

A preferred embodiment of the invention is in an improved diffusion barrier in a semiconductor contact. The improved contact is schematically illustrated in FIG. 5. As discussed heretofore, in semiconductor contacting technology, a layer of Cu for conductivity and a layer of Au for corrosion inhibition and solderability must be kept from interacting in order to have reproducible reliable high yield devices. The conditions of processing, however, with multiple temperature excursions, operate to cause more diffusion of the Cu into the Au than is desirable and as illustrated in connection with FIGS. 2 and 3, the Cu diffuses through a Ni barrier layer and into the Au layer.

In accordance with the invention, an improved barrier is provided in a stack 10 to keep atoms from a Cu conductivity layer 11 from diffusing into and affecting the properties of an Au corrosion inhibiting and solderability enhancing layer 12, effectively reducing the Cu present in the Au layer 12 after annealing for 2 hrs. at 400° C. to about 0.2 to 0.44%. The improved barrier 13 is made up of three layers, an interlayer 14 of Au separated from the Cu layer 11 on one side by a layer 15 of Ni and separated from the Au layer on the other side by a layer 16 of Ni.

The layers 15 and 16 are chosen for standard stress and conductivity compatibility with the rest of the stack 10 and to provide a barrier function to diffusing atoms out of the adjacent layers. The interlayer 14 is chosen not only for compatibility in the stack but also to provide a sink function for any diffusing Au or Cu atoms, particularly Cu, that pass through layer 15. Compounds, such as $Cu_3Au$, $CuAu$ or $CuAu_3$ are usually formed in interlayer 14.

The effectiveness of the improved barrier 13 of the invention is illustrated in connection with FIGS. 6 and 7 which are graphs of Auger material analyses of the Au layer 12 of the stack 10 containing the barrier of the invention after an annealing temperature cycle of 400° C. for 2 hrs.

Figure 6:
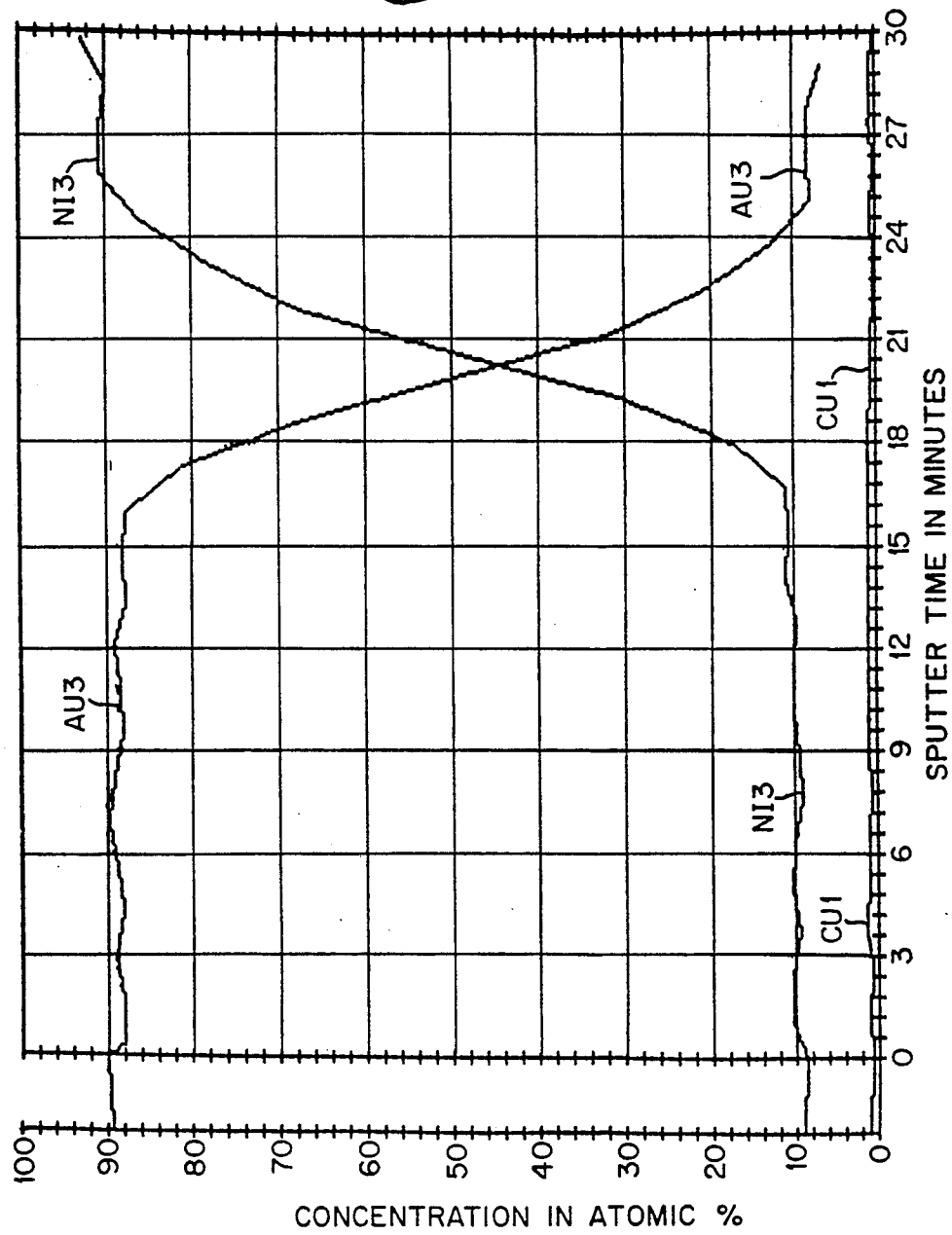
FIG. 6 is an Auger analysis graph of the improved barrier of the invention after annealing and where the external layers are Au and Cu and the barrier is NiAuNi.

In FIGS. 6 and 5, the sample includes an evaporated 400 Å Cr adhesion layer on a Si substrate, not shown, over which there is an evaporated 2 micrometer layer 11 of Cu followed by a 1 micrometer thick layer 15 of Ni electrodeposited from a SELREX® SULFAMEX® nickel plating solution, standard in the art, under the deposition conditions of pH 3.25, a current density of 15 mA/cm² and a temperature of 50° C. Over the layer 15 is the interlayer 14 of 1060 Å thick Au electrodeposited from a SELREX® BDT® 510 gold electroplating solution, standard in the art, under the deposition conditions of pH 8.70 at a current density of 2.72 mA/cm² at a temperature of 50° C. The Ni layer 16 and the Au layer 12 are serially deposited, respectively, under the same conditions and thicknesses as the layers 15 and 14.

Referring to FIG. 6, the graph of an Auger analysis of layer 12 of FIG. 5 indicates a radical drop in Cu with the improved barrier of the invention.

In a microprobe analysis in individual probings, at a 5 KV beam energy, the Ni composition was 8.3% atomic with a ±3% precision and at one of three probing points no Cu detected, at a second point the Cu composition was 0.2 atomic % and at a third point 0.44 atomic % with relative precisions of ±50% and accuracies of ±20%.

Figure 7:
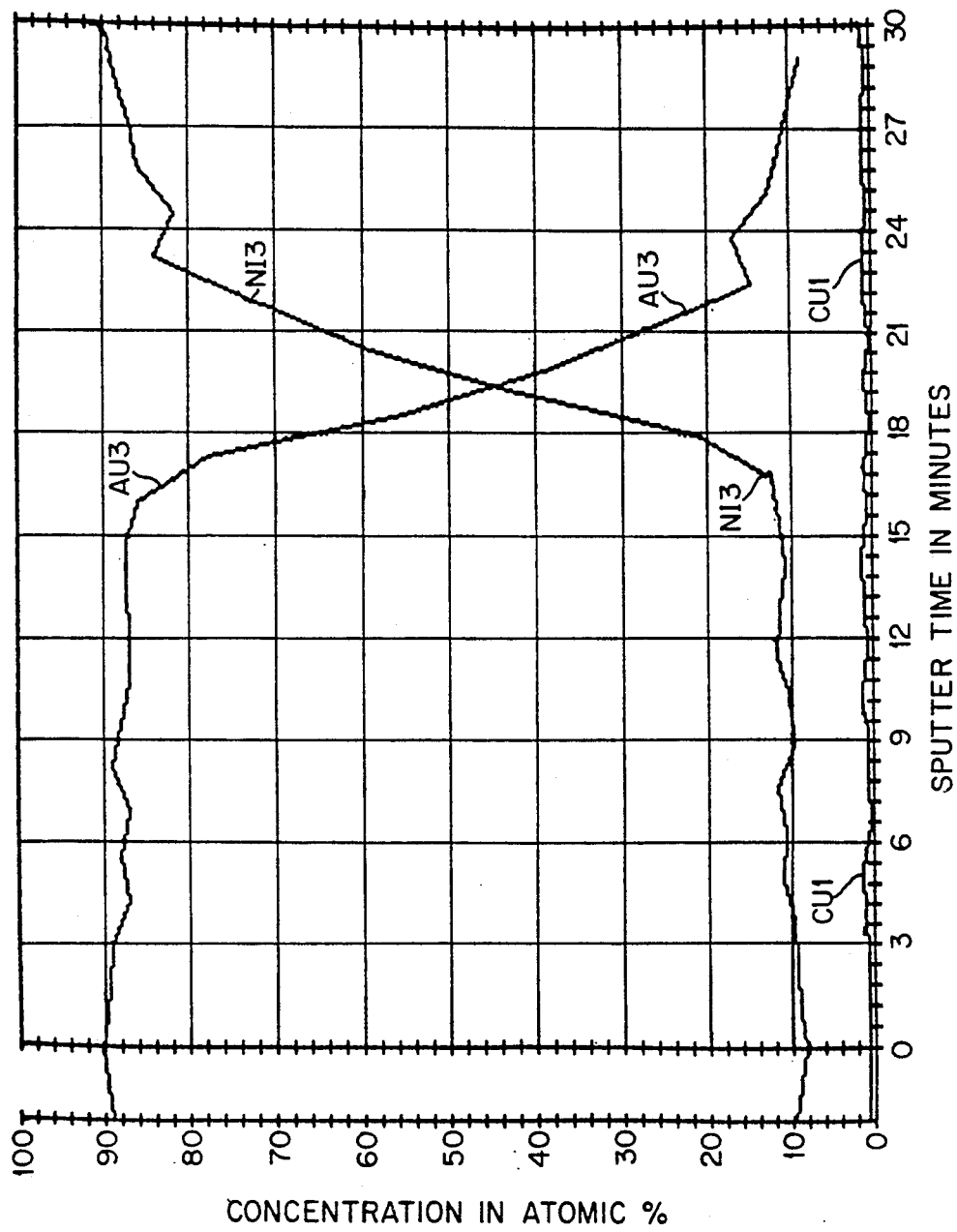
FIG. 7 is an Auger analysis graph at a different Ni thickness of the improved barrier of the invention after annealing and where the external layers are Au and Cu and where the barrier is NiAuNi.

The radical drop of Cu in the Au layer 12 of FIG. 5 with the barrier of the invention is confirmed in the Auger analysis graphs of both FIGS. 6 and 7.

In FIG. 7, the sample analyzed differs from that of FIG. 6 only by the fact that the Ni layers 15 and 16 are 1.5 micrometers thick. All other layer compositions, dimensions and fabrication are the same as the sample of FIG. 6.

Referring to FIG. 7, the electron microprobe analysis indicates that the Ni composition in the Au layer 12 is 8.7% atomic with a relative precision of ±2% and a relative accuracy of ±5% while the Cu composition at three individual probing points was similar and at 0.15% atomic or less.

What has been described is an improved thin film barrier employing an atom energy sink interlayer between two barrier layers.

Having thus described our invention, what we claim as new and desire to secure by Letters Patent is:

1. An electronic device contact structure on an electronic device body having therein a barrier for prevention of atomic interaction between a first thin film layer of Au and a second thin film layer of Cu,
   said barrier being positioned between said first and said second thin film layers, and,
   said barrier consisting of:
   a third thin film layer of Au having one surface thereof contiguous with one surface of said first thin film layer,
   a fourth thin film layer of Au having one surface thereof contiguous with the remaining surface of said third thin film layer, and,
   a fifth thin film layer of Ni having one surface thereof contiguous with the remaining surface of said fourth thin film layer and having the remaining surface thereof contiguous with one surface of said second thin film layer.

2. The contact structure of claim 1 wherein said second thin film layer is 2 micrometers thick, said first thin film layer and said fourth thin film layers are approximately 1060 Å thick and, said third thin film layer and said fifth thin film layer are in the range of 1 to 1.5 micrometers thick.

3. A barrier structure for prevention of atomic interaction between a first thin film layer of Au and a second thin film layer of Cu, said first and second thin film layers being of 2 micrometers or less in thickness, in an electronic device body, said barrier consisting of:
   a third thin film layer of Ni having one surface thereof contiguous with one surface of said first thin film layer,
   a fourth thin film layer of Au having one surface thereof contiguous with the remaining surface of said third thin film layer, and,
   a fifth thin film layer of Ni having one surface thereof contiguous with the remaining surface of said fourth thin film layer and having the remaining surface of said fifth thin film layer contiguous with one surface of said second thin film layer,
   said third, fourth and fifth thin film layers being 2 micrometers or less in thickness.

4. The contact structure of claim 3 wherein said second thin film layer is 2 micrometers thick, said first thin film layer and said fourth thin film layers are approximately 1060 Å thick and, said third thin film layer and said fifth thin film layer are in the range of 1 to 1.5 micrometers thick.

* * * * *